(12) United States Patent
Chen et al.

(10) Patent No.: US 6,465,864 B2
(45) Date of Patent: Oct. 15, 2002

(54) DIODE STRUCTURE ON MOS WAFER

(75) Inventors: Te-Wei Chen, Hsinchu Hsien; Jia Jio Huang, Taichung, both of (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 09/793,945

(22) Filed: Feb. 27, 2001

(65) Prior Publication Data

US 2002/0109202 A1 Aug. 15, 2002

(30) Foreign Application Priority Data

Feb. 13, 2001 (TW) ..................................... 090103093 A

(51) Int. Cl.$^7$ ............................................. H01L 29/00
(52) U.S. Cl. ........................ 257/499; 257/140; 257/141; 257/162; 711/115
(58) Field of Search ................................. 257/140, 141, 257/162, 175, 180, 903; 711/115

(56) References Cited

U.S. PATENT DOCUMENTS 6,104,045 A * 8/2000 Forbes et al. ................ 257/141
6,108,751 A * 8/2000 Lee et al. .................... 711/115

* cited by examiner

Primary Examiner—David Nelms
Assistant Examiner—Mai-Huong Tran
(74) Attorney, Agent, or Firm—J. C. Patents

(57) ABSTRACT

Three diode structures on a metal-oxide-semiconductor (MOS) wafer. Each diode structure is capable of reducing parasitic current through the wafer and hence increasing the power conversion efficiency of a voltage step-up circuit.

23 Claims, 3 Drawing Sheets

DIODE STRUCTURE ON MOS WAFER

CROSS-REFERENCE TO RELATED APPLICATION

This application claims the priority benefit of Taiwan application serial no. 90103093, filed Feb. 13, 2001.

BACKGROUND OF THE INVENTION

1. Field of Invention

The present invention relates to a diode structure on a MOS wafer. More particularly, the present invention relates to a diode structure that produces a low parasitic current due to a built-in barrier layer or an oxide layer.

2. Description of Related Art

In general, a voltage (typically, 12V) must be applied to an electrically erasable programmable read only memory (EEPROM) to erase stored data. However, most computer systems demand a driving voltage of only 3.3V or 5V, and hence a 12V supply is rarely supplied. To erase stored data within an EEPROM unit, a step-up circuit is needed to provide the necessary high voltage. FIG. 1 is a diagram showing a conventional step-up circuit module capable of generating a 12V output.

The voltage step-up circuit 100 shown in FIG. 1 includes a first transistor 102, a second transistor 104, an inductor 106 and a diode 108. A power voltage VCC of 5V is used. The transistors 102 and 104 are switched by signals S1 and S2 sent to their respective gates. When both transistors 102 and 104 are conductive, a current $i_L$ will flow through the inductor 106, the first transistor 102 and the second transistor 104. On the other hand, when any one of the transistors 102 and 104 is closed, the current $i_L$ will flow via the inductor 106 and the diode 108. By timing the conductance of the transistors 102 and 104 and selecting appropriate electrical properties for the inductor 106, a voltage at terminal V2 higher than the voltage at terminal V1 can be produced. The voltage at the terminal V2 can be driven to a voltage (12V) high enough to operate the EEPROM.

In FIG. 1, if the diode 108 in the voltage step-up circuit 100 is a discrete component, there are few problems in applications. However, if the diode 108 is fabricated on the same wafer housing other MOS transistors, the power conversion capacity of the step-up circuit 100 may drop.

FIG. 2 is a schematic cross-sectional view of a conventional diode on a MOS wafer. As shown in FIG. 2, an n-well 202 is formed in a p-substrate 200. A p$^+$-doped region 204 and an n$^+$-doped region 206 are formed within the n-well 202. The p$^+$-doped region serves as the anode of the diode while the n$^+$-doped region 206 serves as the cathode of the diode. A p$^+$-doped region 208 is also formed in the p-substrate 200 to one side of the n-well 202. The p$^+$-doped region 208 serves as a ground (GND) terminal permitting the flow of a substrate current.

Due to the presence of a parasitic path (p$^+$-doped region 204—n-well 202—p substrate 200—p$^+$-doped region 208), a current i flowing in from the anode of the diode into the p$^+$-doped region 204 will diverge and produce a current $i_D$ and a current $i_p$. The current $i_D$ flows via the p$^+$-doped region 204, the n-well 202, the n$^+$-doped region 206 and arrives at the anode of the diode. The current $i_p$ flows via the parasitic path and arrives at the ground terminal (GND).

However, while the current $i_D$ is a useful operating current for the diode, the current $i_p$ is a parasitic current of the MOS wafer representing waste power. Since power conversion efficiency of the voltage step-up circuit depends on the current $i_D$, power conversion efficiency will drop in the presence of the parasitic current $i_p$. That means, the higher the parasitic current, the lower will be the power conversion capacity of the voltage step-up circuit.

SUMMARY OF THE INVENTION

Accordingly, one object of the present invention is to provide a diode layout structure having a low parasitic current so that power conversion efficiency of a voltage step-up circuit is increased.

To achieve these and other advantages and in accordance with the purpose of the invention, as embodied and broadly described herein, the invention provides a diode layout structure on a silicon wafer. The diode structure includes a substrate, a first ion-doped well, a first ion-doped region, a second ion-doped region, a second ion-doped well and a third ion-doped region. The first ion-doped well is formed in the substrate. The first ion-doped region is formed in the first ion-doped well and the second ion-doped region is formed in the first ion-doped well to one side of the first ion-doped region without touching the first ion-doped region. The second ion-doped well having a circular shape is formed in the substrate surrounding the first ion-doped well without touching the first ion-doped well. The third ion-doped region, also having a circular shape, is formed inside the circular second ion-doped well.

This invention also provides a second type of diode layout structure on a silicon wafer. The diode structure includes a substrate, an oxide layer, a first ion-doped region, a second ion-doped region and a third ion-doped region. The oxide layer is formed over the substrate. The first ion-doped region is formed over the oxide layer. The second ion-doped region is formed over the oxide layer on one side and in contact with the first ion-doped region. The third ion-doped region is formed over the oxide layer on one side and in contact with the second ion-doped region.

This invention also provides a third type of diode layout structure on a silicon wafer. The diode structure includes a substrate, an ion-doped well, a first ion-doped region, a second ion-doped region, a deep-layer ion-doped well and a third ion-doped well. An ion-doped well having a circular shape is formed in the substrate. The first ion-doped region is formed in the substrate within and having no contact with the circular ion-doped well. The second ion-doped region is formed in the substrate to one side of the first ion-doped region. The second ion-doped region has no contact with either the first ion-doped region or the circular ion-doped well. A deep-layer ion-doped well is formed in the substrate underneath but without contact with the first ion-doped region and externally bounded by the circular ion-doped well. The third ion-doped region is formed inside the circular ion-doped well above the deep-layer ion-doped well. Furthermore, the third ion-doped region is in contact with the first ion-doped region, the second ion-doped region, the ion-doped well and the deep-layer ion-doped well.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
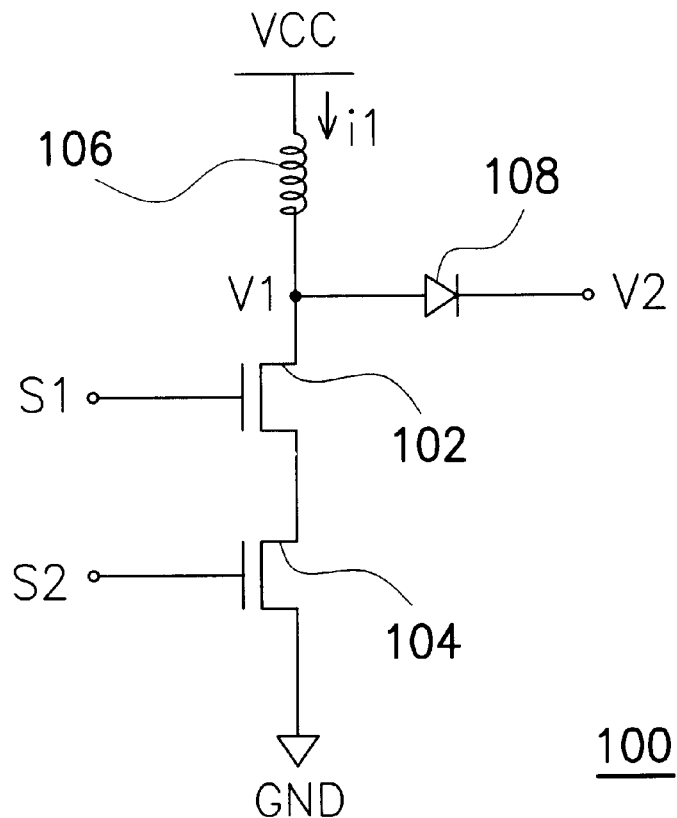
FIG. 1 is a diagram showing a conventional step-up circuit module.
Figure 2:
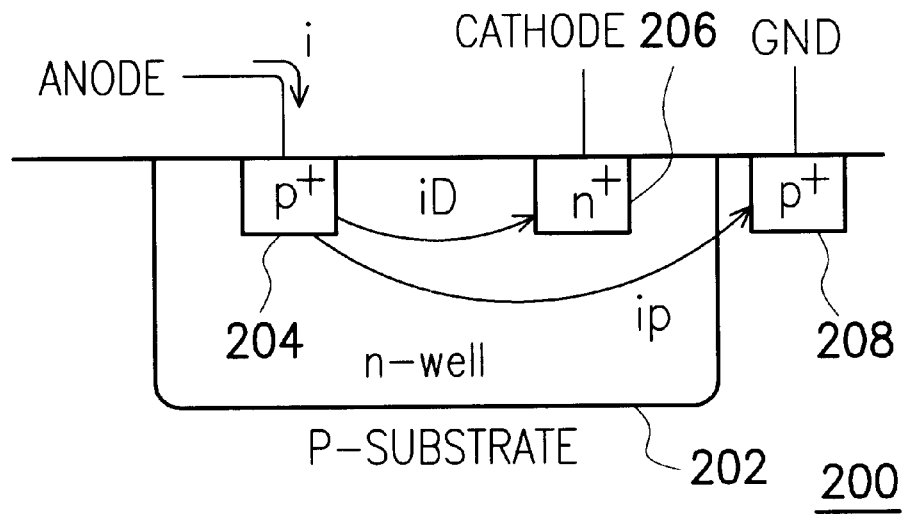
FIG. 2 is a schematic cross-sectional view of a conventional diode on a MOS wafer.

Reference will now be made in detail to the present preferred embodiments of the invention, examples of which are illustrated in the accompanying drawings. Wherever possible, the same reference numbers are used in the drawings and the description to refer to the same or like parts.

Figure 3:
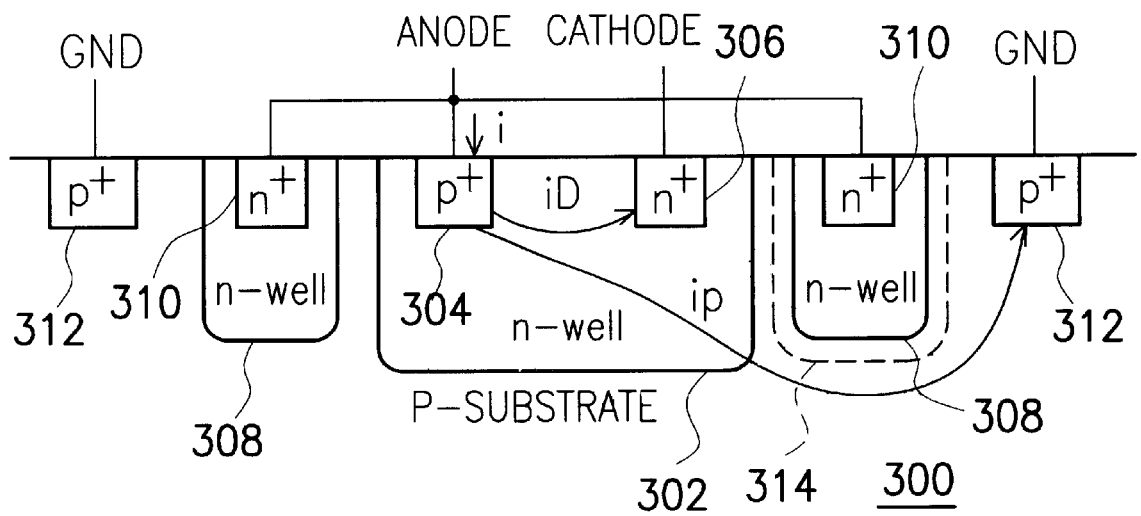
FIG. 3 is a schematic cross-sectional view showing a diode structure on a MOS wafer according to a first embodiment of this invention.

FIG. 3 is a schematic cross-sectional view showing a diode structure on a MOS wafer according to a first embodiment of this invention. As shown in FIG. 3, an n-well 302 is formed in a p-substrate 300. A $p^+$-doped region 304 is formed in the n-well 302 and an $n^+$-doped region 306 is formed in the n-well 302 to one side but not in contact with the $p^+$-doped region 304.

An n-well 308 is formed in the p-substrate 300. The n-well 308 has a circular shape and encloses, but without contact, the n-well 302. An $n^+$-doped region 310 also having a circular shape is formed within the n-well 308. A $p^+$-doped region 312 is formed in the p-substrate 300 outside of, and without contact with, the circular n-well 308.

In FIG. 3, both the $p^+$-doped region 304 and the $n^+$-doped region 310 have a metal contact for electrical connection. Due to the presence of a parasitic path in the MOS wafer ($p^+$-doped region 304—n-well 302—p-substrate 300—$p^+$-doped region 312), a current i flowing in from the anode end of the diode into the $p^+$-doped region 304 diverges to produce a current $i_D$ and another current $i_p$. The current $i_D$ flows via the $p^+$-doped region 304, the n-well 302, the $n^+$-doped region 306 and arrives at the cathode terminal of the diode. The current $i_p$ flows via the parasitic route (that is, via $p^+$-doped region 304—n-well 302—p-substrate 300—$p^+$-doped region 312) and reaches the ground terminal (GND).

Since the $n^+$-doped region 310, the $p^+$-doped region 304 and the anode terminal of the diode serve as electrical contacts, a barrier layer 314 is created at the interface between the n-well 308 and the p-substrate 300. This barrier 314 leads to a greater resistance to the parasitic pathway (the pathway, $p^+$-doped region 304—n-well 302—p-substrate 300—$p^+$-doped region 312). Hence, magnitude of the parasitic current $i_p$ is greatly lowered leading to a great increase in the power conversion efficiency of a voltage step-up circuit.

Figure 4:
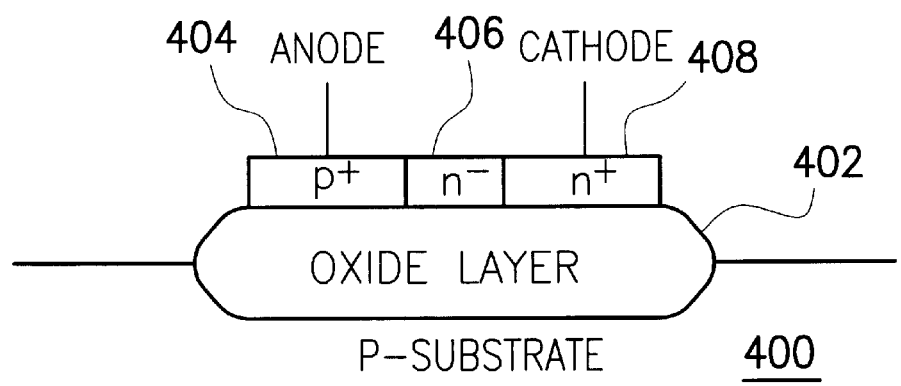
FIG. 4 is a schematic cross-sectional view showing a diode structure on a MOS wafer according to a second embodiment of this invention.

FIG. 4 is a schematic cross-sectional view showing a diode structure on a MOS wafer according to a second embodiment of this invention. As shown in FIG. 4, an oxide layer 402 is formed over a p-substrate 400. A $p^+$-doped region 404 is formed over the oxide layer 402. An n-doped region 406 (a p-doped region may be formed instead) is formed over the oxide layer 402 on one side in contact with the $p^+$-doped region 404. An $n^+$-doped region 408 is formed over the oxide layer 402 on one side in contact with the n-doped region 406.

In FIG. 4, the diode (pathway, $p^+$-doped region 404—n-doped region 406—$n^+$-doped region 408) is formed above the oxide layer 402. Since the diode is completely separated from the p-substrate 400, no parasitic pathway and hence no parasitic current is present. Ultimately, power conversion efficiency of a voltage step-up circuit is increased.

Figure 5:
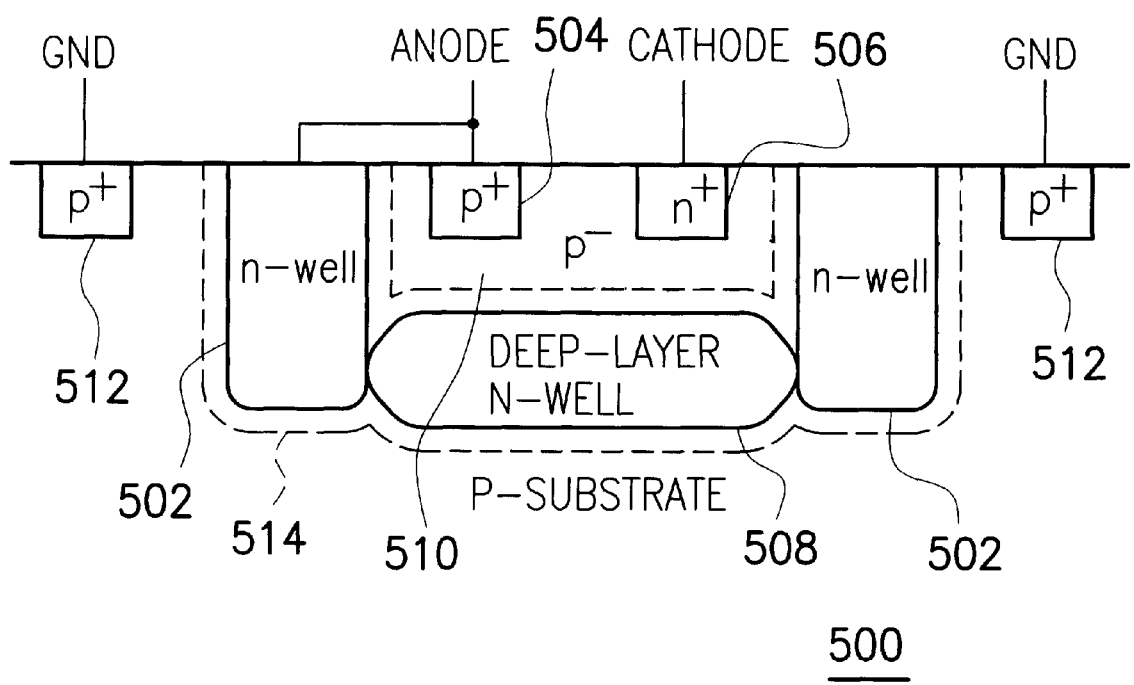
FIG. 5 is a schematic cross-sectional view showing a diode structure on a MOS wafer according to a third embodiment of this invention.

FIG. 5 is a schematic cross-sectional view showing a diode structure on a MOS wafer according to a third embodiment of this invention. As shown in FIG. 5, an n-well 502 having a circular shape is formed in a p-substrate 500. A $p^+$-doped region 504 is formed in the p-substrate 500 inside but not in contact with the circular n-well 502. An $n^+$-doped region 506 is formed in the p-substrate 500 inside the circular n-well 502 to one side of the $p^+$-doped region 504. The $n^+$-doped region 506 is not in contact with the n-well 502 or the $p^+$-doped region 504. A deep-layer n-well 508 is formed in the p-substrate 500 underneath the $p^+$-doped region 504 and the $n^+$-doped region 506. Furthermore, the deep-layer n-well 508 is bounded by and in contact with the circular n-well 502. A p-doped region 510 is formed within the circular n-well 502 above the deep-layer n-well 508. In addition, the p--doped region 510 is in contact with the $p^+$-doped region 504, the $n^+$-doped region 506, the n-well 502 and the deep-layer n-well 508. A $p^+$-doped region 512 is formed in the p-substrate 500 outside and without contact with the circular n-well 502. The $p^+$-doped region 504, the $n^+$-doped region 506 and the n-well 502 have a metal contact for electrical connection.

In FIG. 5, since the n-well 502 as well as the $p^+$-doped region 504 and the $n^+$-doped region 506 are electrically connected by the doped region with the highest potential, the n-well 502 and the deep-layer n-well 508 as well as the p-substrate 500 and p-doped region 510 form a barrier layer 514. This barrier layer 514 increases resistance to the parasitic pathway so that a smaller parasitic current is produced. Consequently, the power conversion efficiency of a voltage step-up circuit will increase.

In summary, the three diode structures fabricated on a MOS wafer according to this invention are capable of reducing the parasitic current flowing through a parasitic pathway or eliminating the parasitic current altogether. Ultimately, power conversion efficiency of a voltage step-up circuit fabricated on the MOS wafer will increase.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A diode structure on a metal-oxide-semiconductor (MOS) wafer, comprising:
    a substrate;
    a first ion-doped well in the substrate;
    a first ion-doped region in the first ion-doped well;
    a second ion-doped region in the first ion-doped well to one side of the first ion-doped region but without contact with the first ion-doped region;
    a ring-like second ion-doped well in the substrate that surrounds the first ion-doped well but without contact with the first ion-doped well; and
    a ring-like third ion-doped region within the second ion-doped well.

2. The diode structure of claim 1, wherein the substrate is a p-substrate.

3. The diode structure of claim 1, wherein the first ion-doped well and the second ion-doped well are n-doped wells.

4. The diode structure of claim 1, wherein the first ion-doped region is a heavily p-doped region.

5. The diode structure of claim 1, wherein the second ion-doped region and the third ion-doped region are heavily n-doped regions.

6. The diode structure of claim 1, wherein a fourth ion-doped region is also formed in the substrate such that the fourth ion-doped region is located outside the second ion-doped well but without touching the second ion-doped well.

7. The diode structure of claim 6, wherein the fourth ion-doped region is a heavily p-doped region.

8. The diode structure of claim 1, wherein the first ion-doped region and the third ion-doped region have a metallic contact for electrical connection.

9. A diode structure on a metal-oxide-semiconductor (MOS) wafer, comprising:
    a substrate;
    an oxide layer over the substrate;
    a first ion-doped region over the oxide layer;
    a second ion-doped region over the oxide layer on one side in contact with the first ion-doped region; and
    a third ion-doped region over the oxide layer on one side in contact with the second ion-doped region.

10. The diode structure of claim 9, wherein the substrate includes a p-substrate.

11. The diode structure of claim 9, wherein the first ion-doped region is a heavily p-doped region.

12. The diode structure of claim 9, wherein the second ion-doped region is a lightly p-doped region or a lightly n-doped region.

13. The diode structure of claim 9, wherein the third ion-doped region is a heavily n-doped region.

14. A diode structure on a metal-oxide-semiconductor wafer, comprising:
    a substrate;
    a circular ion-doped well in the substrate;
    a first ion-doped region in the substrate inside the circular ion-doped well but without contact with the circular ion-doped well;
    a second ion-doped region in the substrate inside the circular ion-doped well next to the first ion-doped region but without contact with the first ion-doped region;
    a deep-layer ion-doped well in the substrate underneath but without contact with the first ion-doped region and the second ion-doped region, wherein the deep-layer ion-doped well is also bounded by and in contact with the circular ion-doped well; and
    a third ion-doped region inside the circular ion-doped well above the deep-layer ion-doped well, wherein the third ion-doped region is in contact with the first ion-doped region, the second ion-doped region, the circular ion-doped well and the deep-layer ion-doped well.

15. The diode structure of claim 14, wherein the substrate includes a p-substrate.

16. The diode structure of claim 14, wherein the circular ion-doped well is an n-doped well.

17. The diode structure of claim 14, wherein the first ion-doped region is a heavily p-doped region.

18. The diode structure of claim 14, wherein the second ion-doped region is a heavily n-doped region.

19. The diode structure of claim 14, wherein the deep-layer ion-doped well is a deep-layer n-doped well.

20. The diode structure of claim 14, wherein a fourth ion-doped region is also formed in the substrate such that the fourth ion-doped region is located outside the circular ion-doped well but without touching the circular ion-doped well.

21. The diode structure of claim 20, wherein the fourth ion-doped region is a heavily p-doped region.

22. The diode structure of claim 14, wherein the first ion-doped region and the second ion-doped region have a highest potential doped region in electrical contact with the ion-doped well via a metallic contact.

23. The diode structure of claim 14, wherein the third ion-doped region is a lightly p-doped region.

* * * * *